US010212870B2

(12) United States Patent
Hall et al.

(10) Patent No.: US 10,212,870 B2
(45) Date of Patent: *Feb. 19, 2019

(54) BRIDGING APPARATUS

(71) Applicants: David R. Hall, Provo, UT (US); Andrew Priddis, Mapleton, UT (US); Benjamin Jensen, Orem, UT (US); Max Tarver, Provo, UT (US); Kelly Knight, Provo, UT (US)

(72) Inventors: David R. Hall, Provo, UT (US); Andrew Priddis, Mapleton, UT (US); Benjamin Jensen, Orem, UT (US); Max Tarver, Provo, UT (US); Kelly Knight, Provo, UT (US)

(73) Assignee: Hall Labs LLC, Provo, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/895,269

(22) Filed: Feb. 13, 2018

(65) Prior Publication Data

US 2018/0178976 A1 Jun. 28, 2018

Related U.S. Application Data

(63) Continuation of application No. 15/296,455, filed on Oct. 18, 2016, now Pat. No. 9,932,171.

(51) Int. Cl.
*B66B 17/18* (2006.01)
*B66B 13/30* (2006.01)

(52) U.S. Cl.
CPC .......... *H05K 999/99* (2013.01); *B66B 13/301* (2013.01); *B66B 17/18* (2013.01)

(58) Field of Classification Search
CPC ....... B66B 17/18; B66B 17/16; B66B 13/301; B66B 17/00; B65D 90/12; B65G 69/28; B65G 69/00
See application file for complete search history.

(56) References Cited

U.S. PATENT DOCUMENTS 2,120,081 A * 6/1938 Alexander .............. B66B 17/18 14/50
2,473,125 A * 6/1949 Alexander .............. B66B 17/18 14/71.1
2,473,127 A * 6/1949 Alexander .............. B66B 17/18 14/71.1

(Continued)

*Primary Examiner* — Abigail A Risic

(57) ABSTRACT

The present invention is directed to a bridging apparatus. The apparatus may be used to span the gap between a vertically movable storage container and a stationary floor structure when a landing of the storage container is planar to a landing of the stationary floor structure. In this invention, the bridging apparatus comprises a bracket, an overlay plate, a hinge comprising a rod, glides, and a switch, which interact with each other and with the vertically movable storage container and the stationary floor structure. As the storage container ascends, the glide of the overlay plate slides angularly contacts a vertical wall of the stationary floor structure and glides along the wall. When the storage container landing is planar with the stationary floor structure landing, the overlay plate rotates downward to a 90-degree angle, resting in a recess in the stationary floor structure landing, engaging the switch to terminate power to the vertically movable storage container.

20 Claims, 4 Drawing Sheets

(56) References Cited

U.S. PATENT DOCUMENTS

| | | | | | |
|---|---|---|---|---|---|
| 2,473,128 | A * | 6/1949 | Alexander | B66B 17/18 | 14/71.1 |
| 2,739,354 | A * | 3/1956 | Pope | B66B 17/18 | 187/334 |
| 3,766,585 | A * | 10/1973 | Yoon | B65G 69/2835 | 14/69.5 |
| 3,806,976 | A * | 4/1974 | Yoon | B65G 69/2858 | 14/69.5 |
| 4,302,145 | A * | 11/1981 | Heisler | B66B 17/18 | 187/400 |
| 5,170,864 | A * | 12/1992 | Berry | B65G 69/287 | 187/400 |
| 7,621,379 | B2 * | 11/2009 | Miller | B66B 13/24 | 187/330 |
| 9,394,142 | B2 * | 7/2016 | Zhu | B66B 17/16 | |
| 2015/0037125 | A1 * | 2/2015 | Zhu | B66B 17/16 | 414/639 |
| 2015/0096842 | A1 * | 4/2015 | Cao | B66B 17/18 | 187/337 |

* cited by examiner

BRIDGING APPARATUS

CROSS-REFERENCE TO RELATED APPLICATIONS

This application is a continuation of the U.S. application Ser. No. 15/296,455, filed on Oct. 18, 2016.

BACKGROUND

Field of the Invention

This invention generally relates to systems for vertically movable storage containers. More particularly, this invention relates to vertically movable storage containers where the container is stowed below floor grade and where an overlay plate is required to bridge the gap that exists between a stationary floor and the storage container floor when the storage container is elevated and the storage container floor and stationary floor become planar.

Background of the Invention

Necessarily, a gap exists between a stationary floor structure and the floor of a vertically movable adjacent structure such as an elevator or storage container. These gaps cause instability and imbalance of carts and other rolled devices as they cross the gap from one floor structure to the adjacent floor structure. Additionally, the gap allows debris to fall between the movable storage container and the stationary floor structure potentially disabling the movable storage container or causing damage to the movable storage container, its operating mechanisms, or the movable storage container staging area. The need exists, then, for a bridging apparatus that is self-actuating, self-retracting, and easy to fit with the installation of a vertically movable storage container, or to retrofit to an existing vertically movable storage container.

SUMMARY

This invention has been developed in response to the present state of the art and, in particular, in response to the problems and needs in the art that have not yet been fully solved by currently available bridging apparatuses and deployment methods. Accordingly, a bridging apparatus has been invented that is connected to a vertically movable storage container. Features and advantages of different embodiments of the invention will become more fully apparent from the following description and appended claims, or may be learned by practice of the invention as set forth hereinafter.

Consistent with the foregoing, a bridging apparatus is disclosed. An overlay plate is disclosed. A bracket to support the overlay plate is disclosed. A hinge to rotatably couple the overlay plate to the bracket is disclosed. A plurality of glide configurations is disclosed.

Overlay is defined as bridging a gap that exists between two structures. Specific to this invention, an overlay plate is a device used to bridge the gap between a stationary floor and a movable storage container floor.

For the purposes of this invention, a movable storage container is defined as a modular unit used to stow items below the level of a stationary floor. The movable storage container may vary in size, and when called, the movable storage container rises from a staging area until the movable storage container floor becomes planar with the stationary floor. When no longer required, the movable storage container retracts downward to the staging area. While the movable storage container is depicted in this invention for the purpose of demonstrating application of the bridging apparatus, the use of the apparatus is not limited to this application.

DETAILED DESCRIPTION OF CERTAIN EMBODIMENTS

It will be readily understood that the components of the present invention, as generally described and illustrated in the Figures herein, may be designed in a wide variety of different configurations. Thus, the following more detailed description of the embodiments of the invention is not intended to limit the scope of the invention, as claimed, but is merely representative of certain examples of presently contemplated embodiments in accordance with the invention. The presently described embodiments will be best understood by reference to the claims and drawings.

Although any number of embodiments may be considered, the following suggests one example: a bridging apparatus comprising a bracket attached to a movable storage container, an overlay plate attached to the bracket by means of a rod, a glide, and a switch. As the storage container retracts into its staging area, the glide causes the overlay plate to rotate upwardly on the rod to a semi-vertical position and rest angularly against a wall of a stationary floor substructure. As the movable storage container moves upwardly, the glide slides along a wall of the stationary floor substructure and as the movable storage container floor becomes planar with a landing of the stationary floor the overlay plate rotates downwardly, engaging the switch when the overlay plate is 90-degrees to the bracket, stopping the movable storage container from further ascending. Features and advantages of additional embodiments of the invention may become more fully apparent or may be learned by practice of the invention as set forth hereinafter.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION OF THE DRAWINGS

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
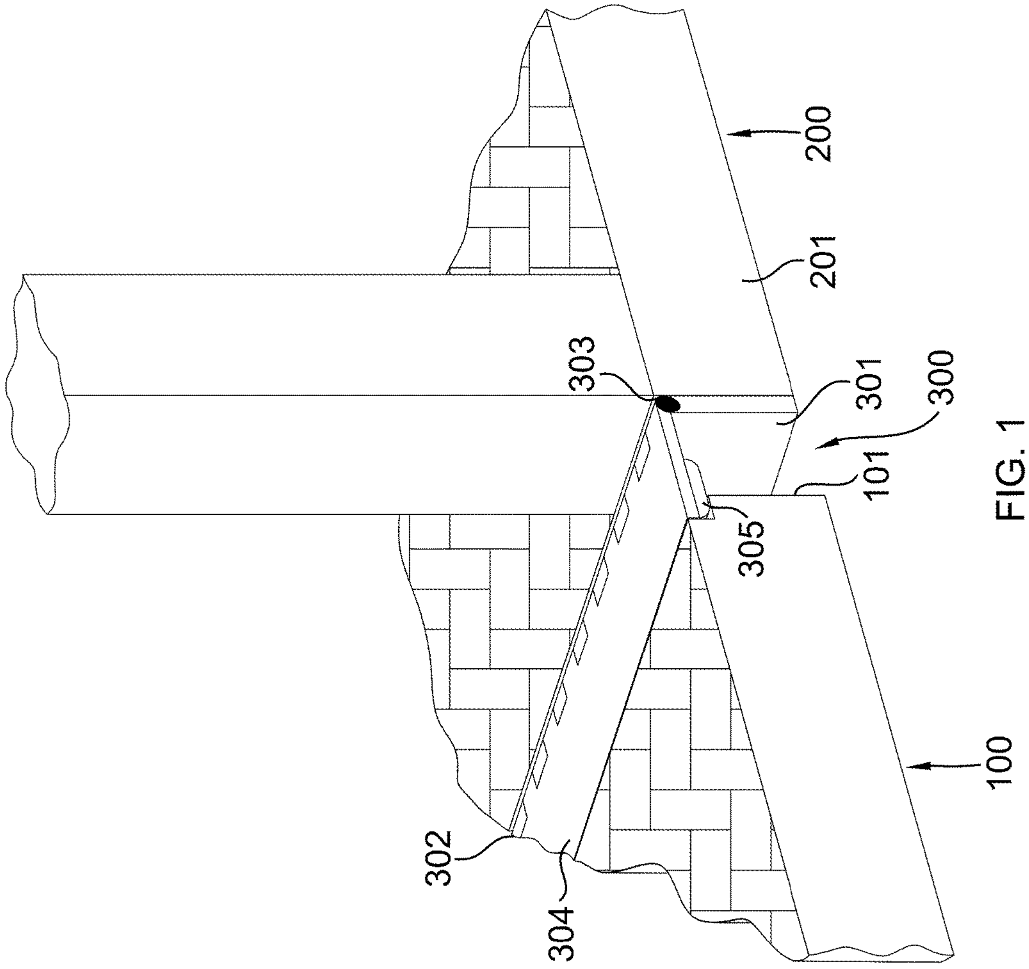
FIG. 1 is an isometric view of a bridging apparatus comprising a bracket attached to a base of a vertical wall of a movable storage container adjacent a wall of a stationary floor structure, an overlay plate spanning the space between the movable storage container and the stationary floor structure.

FIG. 1 is an isometric view of a bridging apparatus 300 comprising a bracket 301 attached to a base of a vertical wall 201 of a movable storage container 200 adjacent a wall 101 of a stationary floor structure 100. The bracket 301 comprises a hinge 302 comprising a rod 303 which rotationally attaches an overlay plate 304 to the bracket 301. The overlay plate 304 comprises a glide 305 along an edge opposite the hinge 302.

Figure 2:
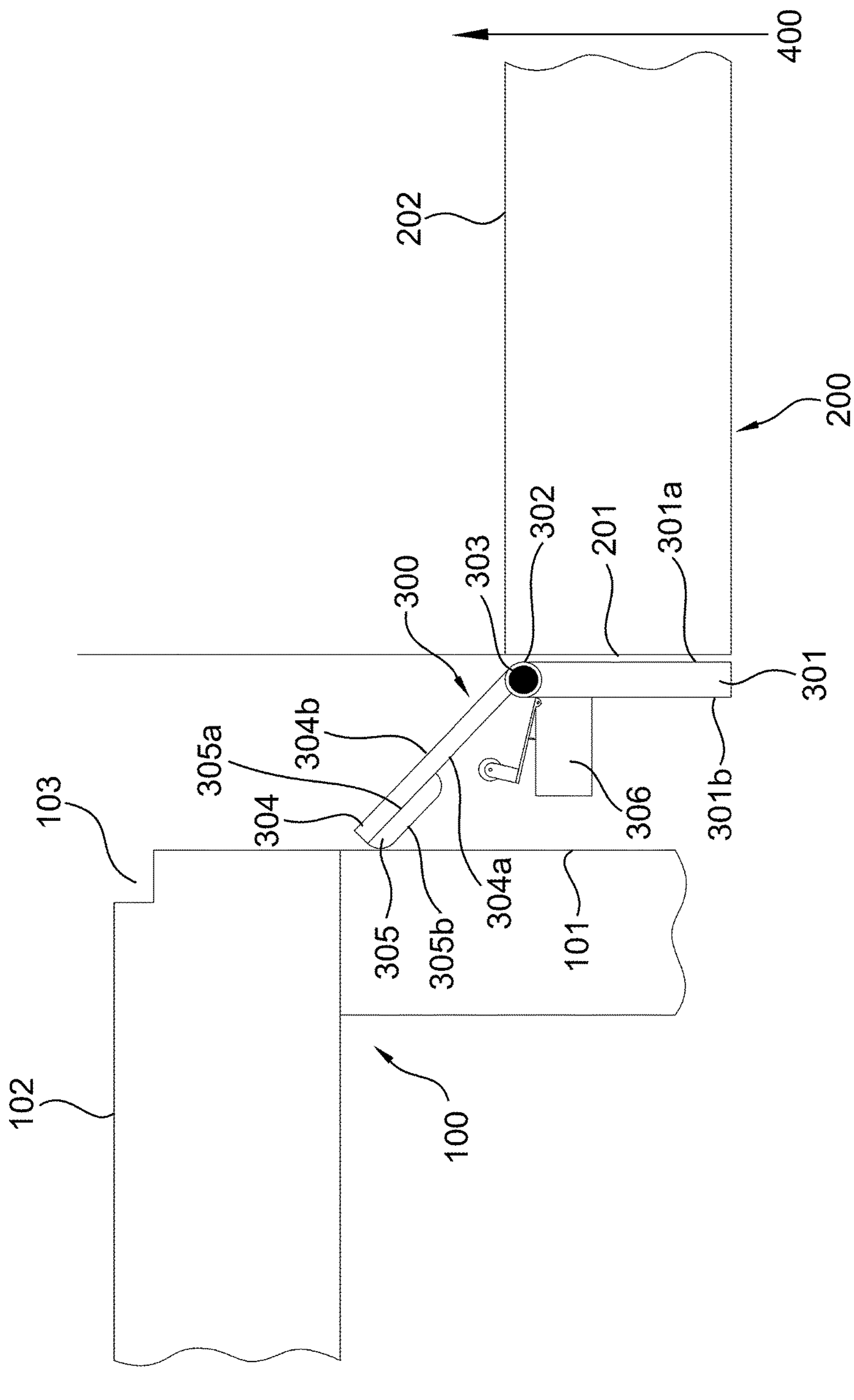
FIG. 2 is a profile view depicting the bridging apparatus comprising a bracket, an overlay plate, a rod, a glide, and a switch, with the overlay plate in angular contact with a wall of a stationary floor structure opposite a vertical wall of a movable storage container.

FIG. 2 is a profile view depicting the bridging apparatus 300 comprising a bracket 301, an overlay plate 304, a hinge 302 comprising a rod 303, a glide 305, and a switch 306. The bracket 301 comprises a first flat surface 301*a*, a second flat surface 301*b*, and a hinge 302 comprising a rod 303. In one embodiment, the bracket 301 comprises aluminum. In other embodiments, the bracket 301 comprises steel, stainless steel, zinc, titanium, nylon, polyoxymethylene, and carbon fiber. In one embodiment, the rod 303 comprises aluminum. In other embodiments, the rod 303 comprises steel, stainless steel, zinc, titanium, nylon, polyoxymethylene, and carbon fiber. The first flat surface 301*a* of the bracket 301 is joined to a vertical wall 201 by means of chemical and mechanical attachments. The overlay plate 304 comprises a first flat surface 304*a* and a second flat surface 304*b*. In one embodiment, the overlay plate 304 comprises aluminum. In other embodiments, the overlay plate 304 comprises steel, stainless steel, zinc, titanium, nylon, polyoxymethylene, and carbon fiber. The glide 305 comprises a flat first surface 305*a* and a convex second surface 305*b*. The flat first surface 305*a* is joined to the first flat surface 304*a* of the overlay plate 304 by means of chemical and mechanical attachments. In one embodiment, the glide 305 comprises aluminum. In other embodiments, the glide 305 comprises steel, stainless steel, zinc, titanium, nylon, carbon fiber, and polyoxymethylene. In another embodiment, the glide 305 comprises a plurality of separate glides intermittently disposed along the first flat surface 304*a* of the overlay plate 304. The overlay plate 304 is rotationally attached to the bracket 301 at the hinge 302 through which the rod 303 is passed. In this Figure, the overlay plate 304 is in angular contact with the wall 101 of the stationary floor structure 100. As the movable storage container 200 moves upward 400 the glide 305 of the overlay plate 304 glides along the wall 101 of the stationary floor structure 100. The switch 306 is joined to the second flat surface 301*b* of the bracket 301 such that when the overlay plate 304 is at less than a 90-degree angle to the bracket 301, the switch 306 is disengaged allowing power to the movable storage container 200 such that a landing 202 of the movable storage container 200 may ascend to a planar position with a landing floor 102 of the stationary floor structure 100. In one embodiment, the switch 306 comprises a mechanical limiting switch. In other embodiments, the switch 306 comprises optical and laser limiting switches.

Figure 3:
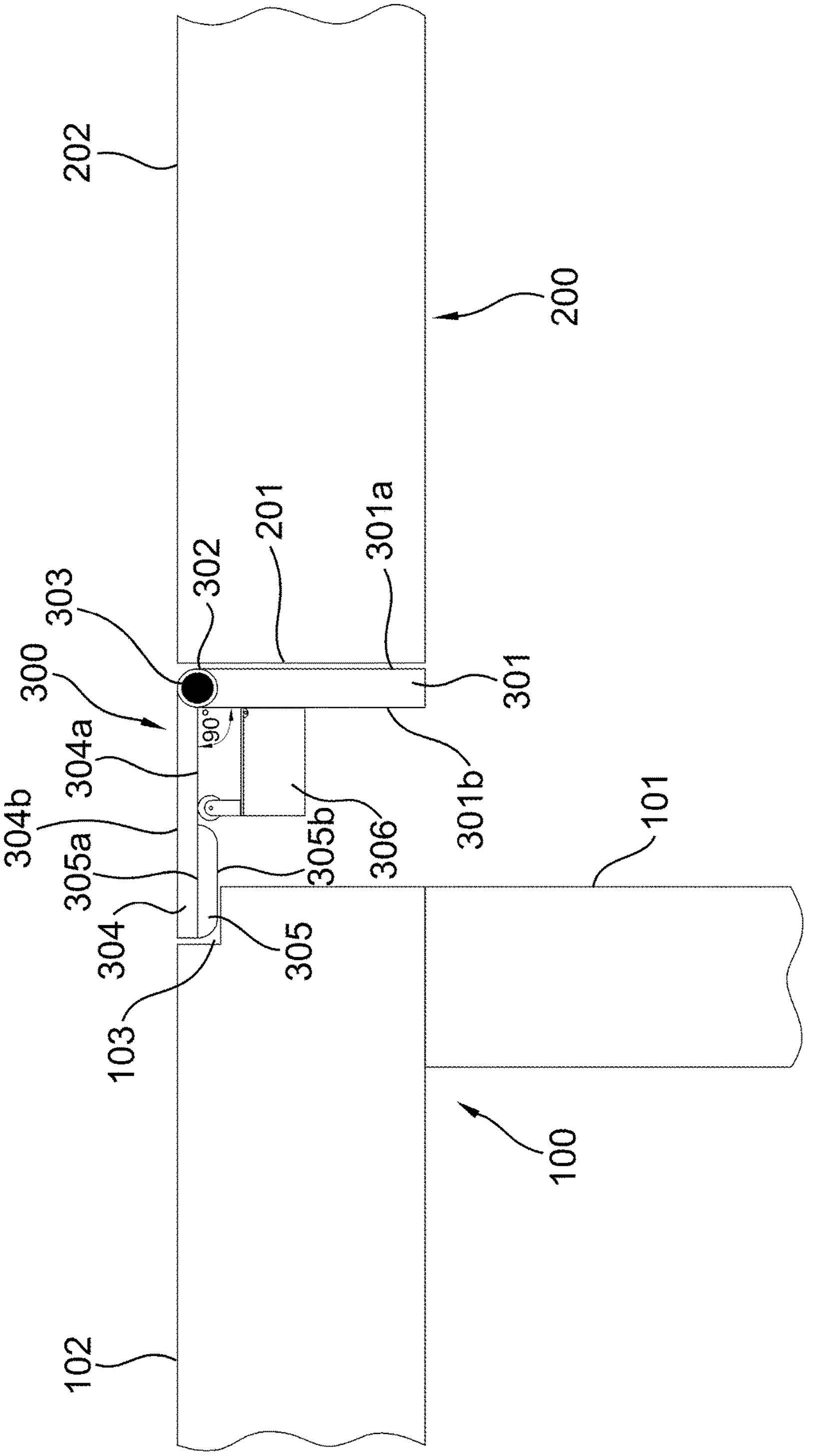
FIG. 3 is a profile view depicting the bridging apparatus comprising a bracket, an overlay plate, a rod, a glide, and a switch, with the overlay plate in a prone position planar to a landing of the stationary floor structure and the movable storage container wherein the overlap plate bridges the space between the stationary floor structure and the movable storage container.

FIG. 3 is a profile view depicting the bridging apparatus 300 comprising a bracket 301, an overlay plate 304, a hinge 302 comprising a rod 303, a glide 305, and a switch 306. The bracket 301 comprises a first flat surface 301*a*, a second flat surface 301*b*, and a hinge 302 comprising a rod 303. In one embodiment, the bracket 301 comprises aluminum. In other embodiments, the bracket 301 comprises steel, stainless steel, zinc, titanium, nylon, polyoxymethylene, and carbon fiber. In one embodiment, the rod 303 comprises aluminum. In other embodiments, the rod 303 comprises steel, stainless steel, zinc, titanium, nylon, polyoxymethylene, and carbon fiber. The first flat surface 301*a* of the bracket 301 is joined to a vertical wall 201 by means of chemical and mechanical attachments. The overlay plate 304 comprises a first flat surface 304*a* and a second flat surface 304*b*. In one embodiment, the overlay plate 304 comprises aluminum. In other embodiments, the overlay plate 304 comprises steel, stainless steel, zinc, titanium, nylon, polyoxymethylene, and carbon fiber. The glide 305 comprises a flat first surface 305*a* and a convex second surface 305*b*. The flat first surface 305*a* is joined to the first flat surface 304*a* of the overlay plate 304 by means of chemical and mechanical attachments. In one embodiment, the glide 305 comprises aluminum. In other embodiments, the glide 305 comprises steel, stainless steel, zinc, titanium, nylon, carbon fiber, and polyoxymethylene. In another embodiment, the glide 305 comprises a plurality of separate glides intermittently disposed along the first flat surface 304*a* of the overlay plate. The overlay plate 304 is rotationally attached to the bracket 301 at the hinge 302 through which the rod 303 is passed. In this Figure, the overlay plate 304 is in a prone position with an edge of the overlay plate 304 opposite the hinge resting in a recess 103 of the stationary floor structure 100. The recess 103 is disposed longitudinally along a side of a landing 102 of the stationary floor structure 100 parallel to the landing floor 202 of the movable storage container 200. The switch 306 is joined to the second flat surface 301*b* of the bracket 301 by means of chemical and mechanical attachments such that when the overlay plate 304 is at a 90-degree angle to the bracket 301, the switch 306 engages, terminating power to the movable storage container 200 such that the landing floor 202 of the movable storage container 200 may not ascend beyond a planar position with the landing floor 102 of the stationary floor structure 100. In one embodiment, the switch 306 comprises a mechanical limiting switch. In other embodiments, the switch 306 comprises optical and laser limiting switches.

Figure 4:
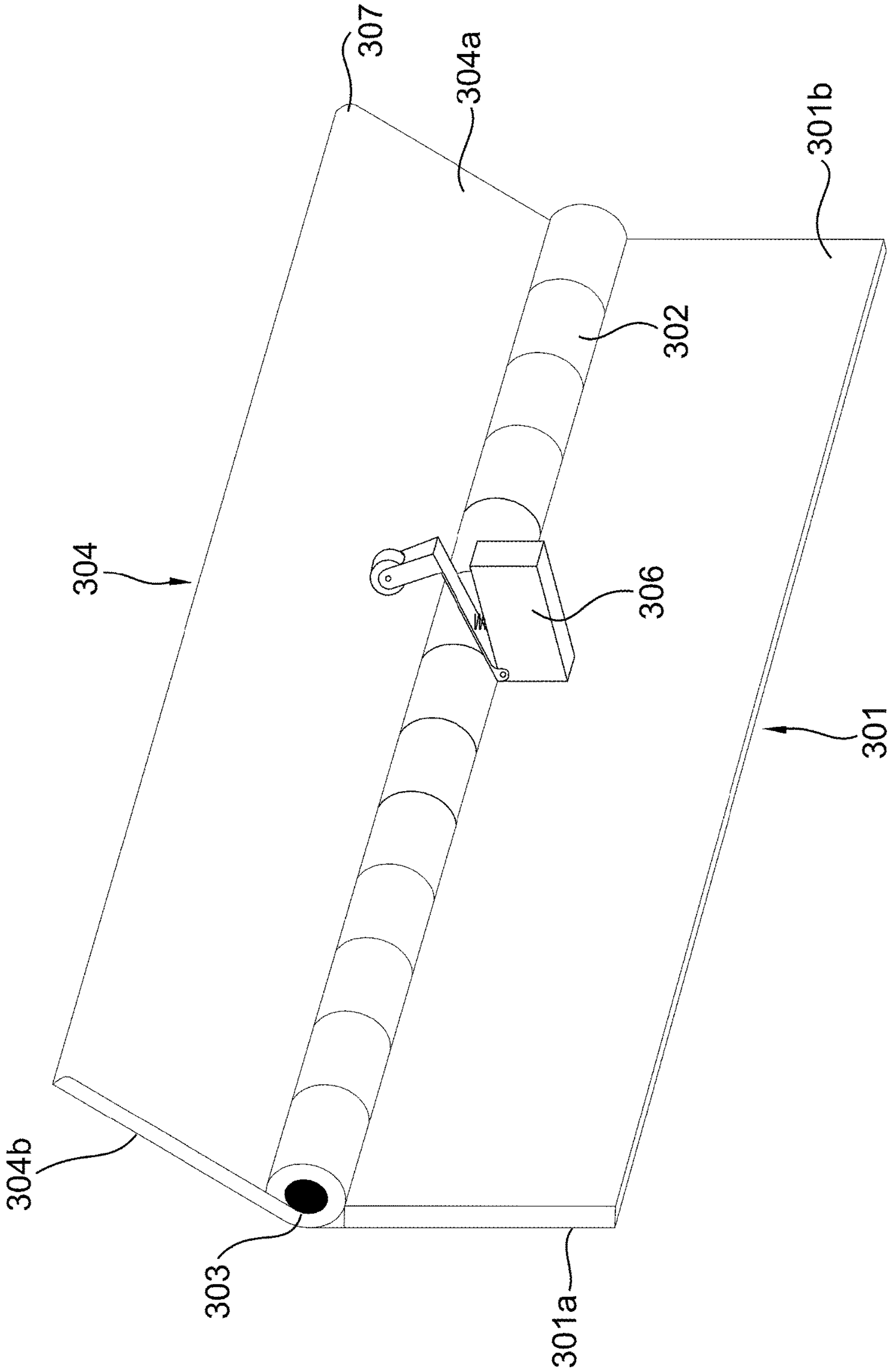
FIG. 4 is an isometric view of the bridging apparatus comprising the bracket comprised of a hinge comprising a rod, the overlay plate, and a switch.

FIG. 4 is an isometric view of the bridging apparatus comprising the bracket 301, the overlay plate 304, and the switch 306. The bracket 301 comprises a first flat surface 301*a*, a second flat surface 301*b*, and a hinge 302 comprising a rod 303. In one embodiment, the bracket 301 comprises aluminum. In other embodiments, the bracket 301 comprises steel, stainless steel, zinc, titanium, nylon, polyoxymethylene, and carbon fiber. In one embodiment, the rod 303 comprises aluminum. In other embodiments, the rod 303 comprises steel, stainless steel, zinc, titanium, nylon, polyoxymethylene, and carbon fiber. The overlay plate 304 comprises a first flat surface 304*a* and a second flat surface 304*b*. The overlay plate 304 is rotatably attached to the bracket 301 by means of the hinge 302 comprising a rod 303. In one embodiment, the overlay plate 304 comprises aluminum. In other embodiments, the overlay plate 304 comprises steel, stainless steel, zinc, titanium, nylon, polyoxymethylene, and carbon fiber. In this embodiment, the overlay plate 304 comprises an integrated glide 307 wherein the glide 307 comprises a curvilinear surface beginning at the edge of the second flat surface 304*b* of the overlay plate 304 opposite the hinge side and rounding to the first flat surface 304*a* of the overlay plate 304. The switch 306 is joined to the second flat surface 301*b* of the bracket 301 by means of chemical and mechanical attachments. In one embodiment, the switch 306 comprises a mechanical limiting switch. In other embodiments, the switch 306 comprises optical and laser limiting switches.

We claim:

1. A bridging apparatus, comprising:
 a hinged overlay plate attached to a vertically moveable surface adjacent to a stationary structure, the hinged overlay plate comprising:
  a glide in angular contact with a wall of the stationary structure; and
  a switch,
 wherein the glide moves along the wall of the stationary structure as the moveable surface moves upward toward a coplanar position with a landing of the stationary structure, the hinged overlay plate rotating to a 90-degree angled, horizontal position as the moveable surface reaches the coplanar position, and
 the switch stopping the upward motion of the moveable surface when the hinged overlay plate reaches the 90-degree angled, horizontal position.

2. The bridging apparatus of claim 1, wherein the glide slides into a recess in the landing as the moveable surface reaches the coplanar position.

3. The bridging apparatus of claim 1, wherein the moveable surface comprises a moveable storage container.

4. The bridging apparatus of claim 1, wherein the hinged overlay plate is attached to a base of the moveable surface.

5. The bridging apparatus of claim 1, wherein the stationary structure comprises a floor structure.

6. The bridging apparatus of claim 1, wherein the bridging apparatus bridges a gap between the moveable surface and the stationary structure.

7. The bridging apparatus of claim 1, wherein the hinged overlay plate comprises metal selected from the group consisting of steel, stainless steel, aluminum, zinc, and titanium.

8. The bridging apparatus of claim 1, wherein the hinged overlay plate comprises materials selected from the group consisting of nylon, polyoxymethylene, and carbon fiber.

9. The bridging apparatus of claim 1, wherein the hinged overlay plate comprises a first surface and a second surface.

10. The bridging apparatus of claim 9, wherein the first surface and the second surface are joined by a hinge.

11. The bridging apparatus of claim 1, wherein the glide comprises a convex surface.

12. The bridging apparatus of claim 1, wherein the glide comprises aluminum, steel, stainless steel, zinc, titanium, nylon, carbon fiber, or polyoxymethylene.

13. The bridging apparatus of claim 1, wherein the glide comprises a plurality of separate glides intermittently disposed along the hinged overlay plate.

14. The bridging apparatus of claim 1, wherein the switch is a mechanical limiting switch.

15. The bridging apparatus of claim 1, wherein the switch comprises an optical and/or laser limiting switch.

16. The bridging apparatus of claim 1, wherein the glide is positioned on a bottom side of the hinged overlay plate, opposite a hinge.

17. A bridging apparatus, comprising:
 a hinged overlay plate attached to a vertically moveable surface adjacent to a stationary structure, the hinged overlay plate comprising:
  a switch,
 wherein the hinged overlay plate rotates to a 90-degree angled, horizontal position as the moveable surface moves upward toward and then reaches a coplanar position with a landing of the stationary structure, and the switch stops the upward motion of the moveable surface when the hinged overlay plate reaches the 90-degree angled, horizontal position.

18. The bridging apparatus of claim 17, wherein the moveable surface comprises a moveable storage container.

19. The bridging apparatus of claim 17, wherein the hinged overlay plate is attached to a base of the moveable surface.

20. The bridging apparatus of claim 17, wherein the stationary structure comprises a floor structure.

* * * * *